(12) United States Patent
Lai et al.

(10) Patent No.: US 7,440,279 B2
(45) Date of Patent: Oct. 21, 2008

(54) HEAT DISSIPATION DEVICE

(75) Inventors: Cheng-Tien Lai, Guangdong (CN);
Zhi-Yong Zhou, Guangdong (CN);
Yi-San Liu, Guangdong (CN)

(73) Assignees: Fu Zhun Precision Industry (Shen Zhen) Co., Ltd., Longhua Town, Bao'an District, Shenzhen, Guangdong Province;
Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,230

(22) Filed: Mar. 14, 2006

(65) Prior Publication Data
US 2007/0217153 A1    Sep. 20, 2007

(51) Int. Cl.
*H05K 7/20* (2006.01)

(52) U.S. Cl. .................. 361/700; 165/80.3; 165/104.33; 165/104.21

(58) Field of Classification Search ........... 361/700; 165/104.33, 104.21, 121, 80.3, 80.4, 104.26; 257/715, E23.088, E23.099, E23.103; 29/157
See application file for complete search history.

(56) References Cited

U.S. PATENT DOCUMENTS

| | | | | |
|---|---|---|---|---|
| 3,680,189 | A * | 8/1972 | Noren ................ | 29/890.032 |
| 5,699,853 | A | 12/1997 | Goth et al. | |
| 6,542,364 | B2 * | 4/2003 | Lai et al. ................ | 361/697 |
| 6,779,595 | B1 | 8/2004 | Chiang | |
| 6,796,373 | B1 * | 9/2004 | Li ........................ | 165/104.21 |
| 6,915,844 | B2 * | 7/2005 | Chou ................... | 165/104.33 |
| 6,918,429 | B2 * | 7/2005 | Lin et al. ................ | 165/80.3 |
| 6,938,682 | B2 * | 9/2005 | Chen et al. ............ | 165/104.33 |
| 6,945,319 | B1 * | 9/2005 | Li et al. ................ | 165/104.33 |
| 6,964,295 | B1 * | 11/2005 | Yu et al. ................ | 165/104.33 |
| 7,000,687 | B2 * | 2/2006 | Ying et al. ............ | 165/104.33 |
| 7,021,368 | B2 * | 4/2006 | Lin et al. ............... | 165/104.33 |
| 7,059,391 | B2 * | 6/2006 | Whitney ................ | 165/104.33 |
| 7,124,806 | B1 * | 10/2006 | Wang et al. ............. | 165/80.3 |
| 7,165,603 | B2 * | 1/2007 | Mochizuki et al. ..... | 165/104.21 |
| 7,298,620 | B2 * | 11/2007 | Wu ........................ | 361/700 |
| 7,342,788 | B2 * | 3/2008 | Nikfar ................... | 361/700 |
| 2004/0035558 | A1 * | 2/2004 | Todd et al. ............. | 165/104.26 |
| 2004/0226697 | A1 * | 11/2004 | Liu ........................ | 165/104.33 |
| 2006/0011329 | A1 * | 1/2006 | Wang et al. ............ | 165/104.33 |
| 2006/0032616 | A1 * | 2/2006 | Yang ..................... | 165/104.33 |
| 2006/0096740 | A1 * | 5/2006 | Zheng ................... | 165/104.26 |
| 2006/0289149 | A1 * | 12/2006 | He ........................ | 165/104.33 |
| 2007/0095509 | A1 * | 5/2007 | Lee et al. ............... | 165/104.33 |
| 2008/0055854 | A1 * | 3/2008 | Zhou et al. ............. | 361/700 |

FOREIGN PATENT DOCUMENTS

| | | |
|---|---|---|
| CN | 2681343 Y | 2/2005 |
| CN | 2696125 Y | 4/2005 |

* cited by examiner

*Primary Examiner*—Jayprakash N Gandhi
*Assistant Examiner*—Courtney L Smith
(74) *Attorney, Agent, or Firm*—Winston Hsu

(57) ABSTRACT

A heat dissipation device includes a heat conducting plate (100) for contacting with an electronic component (400), a heat sink (200) mounted on the heat conducting plate and a heat pipe (300). The heat conducting plate comprises a groove (110) defined in. The heat pipe comprises an evaporating portion (310) sandwiched between the heat conducting plate and the heat sink, and a condensing portion (320) thermally connecting with the heat sink. The evaporating portion comprises a middle portion (3104) having a circular cross section and accommodated in the groove of the heat conducting plate, and a pair of end portions (3102) formed on opposite sides of the middle portion. The end portions have flat bottom surfaces.

6 Claims, 6 Drawing Sheets

HEAT DISSIPATION DEVICE

FIELD OF THE INVENTION

The present invention relates to a heat dissipation device, and more particularly to a heat dissipation device including a heat sink and heat pipes for achieving a better heat dissipation efficiency.

DESCRIPTION OF RELATED ART

As computer technology continues to advance, electronic components such as the central processing units (CPUs) of computers are made to provide faster operational speeds and greater functional capabilities. When a CPU operates at a high speed in a computer enclosure, its temperature usually increases enormously. It is desirable to dissipate the generated heat of the CPU quickly.

Conventionally, a heat dissipation device is used to dissipate heat generated by a CPU. A conventional heat dissipation device generally comprises a heat sink and heat pipes attached to the heat sink. The heat sink comprises a base for contacting with an electronic component mounted on a printed circuit board and a plurality of fins extending upwardly from the base. Each heat pipe comprises an evaporating portion for contacting with the base of the heat sink, and a condensing portion extending from an end of the evaporating portion and thermally connecting with an upper portion of the fins. In use, heat produced by the electronic component is first transferred to the base and then is conducted to the fins to be dissipated. The heat pipes have good heat conductivity and can quickly conduct heat from the base to the fins. The heat originating from the electronic component is then dissipated to ambient air via the fins. Thus, the heat sink is generally designed to have a large heat-exchanging area to improve the heat dissipation efficiency. The bigger the heat-exchanging area is, the higher the heat dissipation efficiency that can be obtained. However, in some situations, the heat sink can not be too large, for example, other components such as electric capacitor are located around the electronic component to be cooled. If the electric capacitor is higher in the enclosure than the electronic component, the heat sink has to be designed to occupy small space to avoid interfering with the electric capacitor. Therefore, the heat-exchanging area of the heat sink is small, and the heat sink can not dissipate the heat transferred from the heat pipes quickly and efficiently any longer. The heat will be accumulated at the heat sink, which may result in that the temperature difference between the evaporating and condensing portions of the heat pipes getting lower, and the heat pipes can not quickly and efficiently remove the heat produced by the electronic component. Therefore, when a higher component is located around the electronic component to be cooled, the conventional heat dissipation device can not keep the electronic component to be cooled in a normal temperature range, which affects the normal operation of the electronic component.

What is needed, therefore, is a heat dissipation device, which can overcome above-described disadvantage of the conventional heat dissipation device.

SUMMARY OF INVENTION

A heat dissipation device comprises a heat conducting plate for contacting with an electronic component, a heat sink mounted on the heat conducting plate and a heat pipe. A groove is defined in the heat conducting plate. The heat pipe comprises an evaporating portion sandwiched between the heat conducting plate and the heat sink, and a condensing portion thermally connecting with the heat sink. The evaporating portion comprises a middle portion having a circular cross section and accommodated in the groove of the heat conducting plate, and a pair of end portions formed on opposite sides of the middle portion. The end portions each have a semi-circular configuration to accommodate other electronic components such as capacitors therebelow. Thus, a size of the heat sink does not need to be reduced, and a high heat dissipation capability of the heat sink can be maintained. Furthermore, a thickness of the heat conducting plate can be reduced to enable the middle portion of the evaporation portion to be located closer to the electronic component, whereby heat generated by the electronic component can quickly reach the evaporation portion of the heat pipe and the heat sink through the heat pipe.

Other advantages and novel features will become more apparent from the following detailed description of preferred embodiments when taken in conjunction with the accompanying drawings, in which:

DETAILED DESCRIPTION

Referring to FIGS. 1-5, a heat dissipation device in accordance with a preferred embodiment of the invention comprises a heat conducting plate 100, a heat sink 200 mounted on the heat conducting plate 100 and two heat pipes 300 thermally connecting with the heat conducting plate 100 and the heat sink 200.

Figure 1:
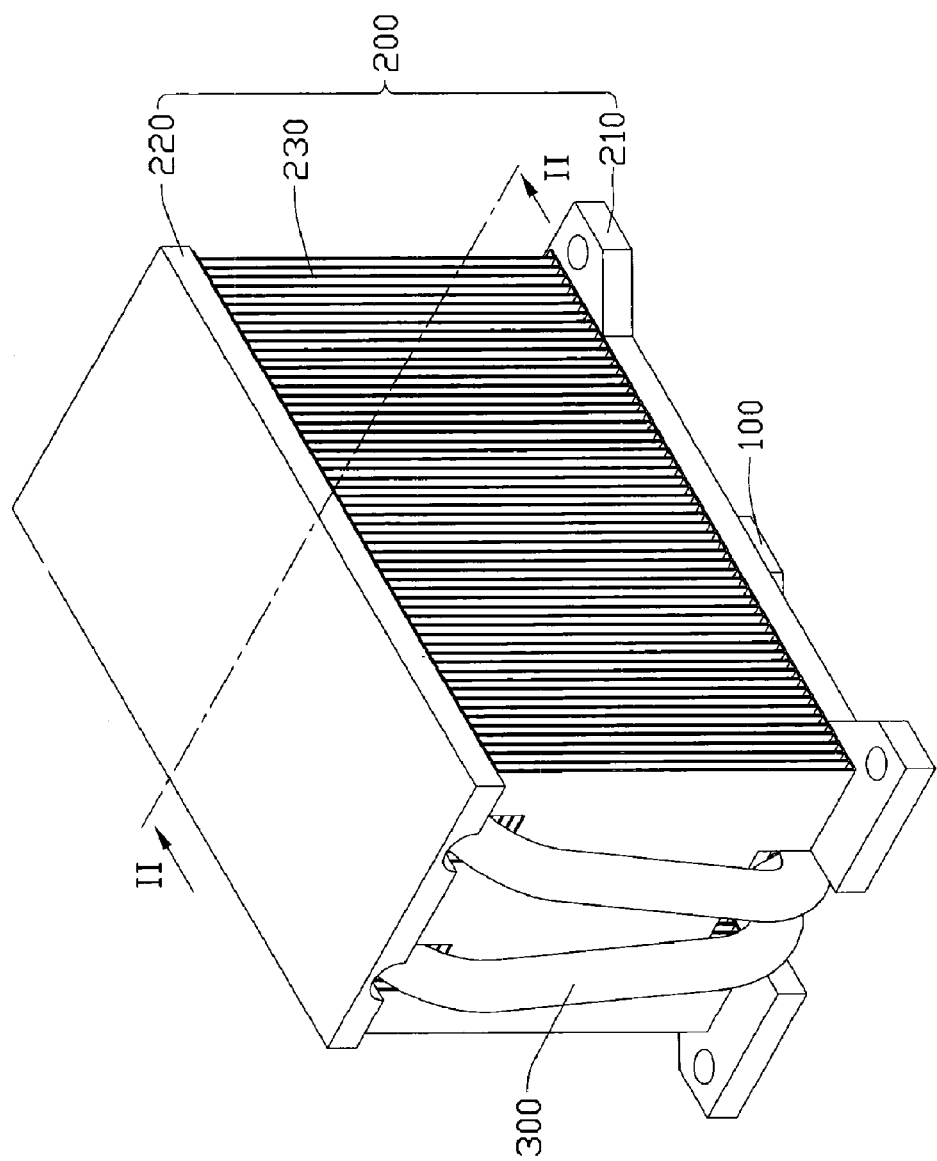
FIG. 1 is a perspective view of a heat dissipation device in accordance with a preferred embodiment of the present invention.
Figure 2:
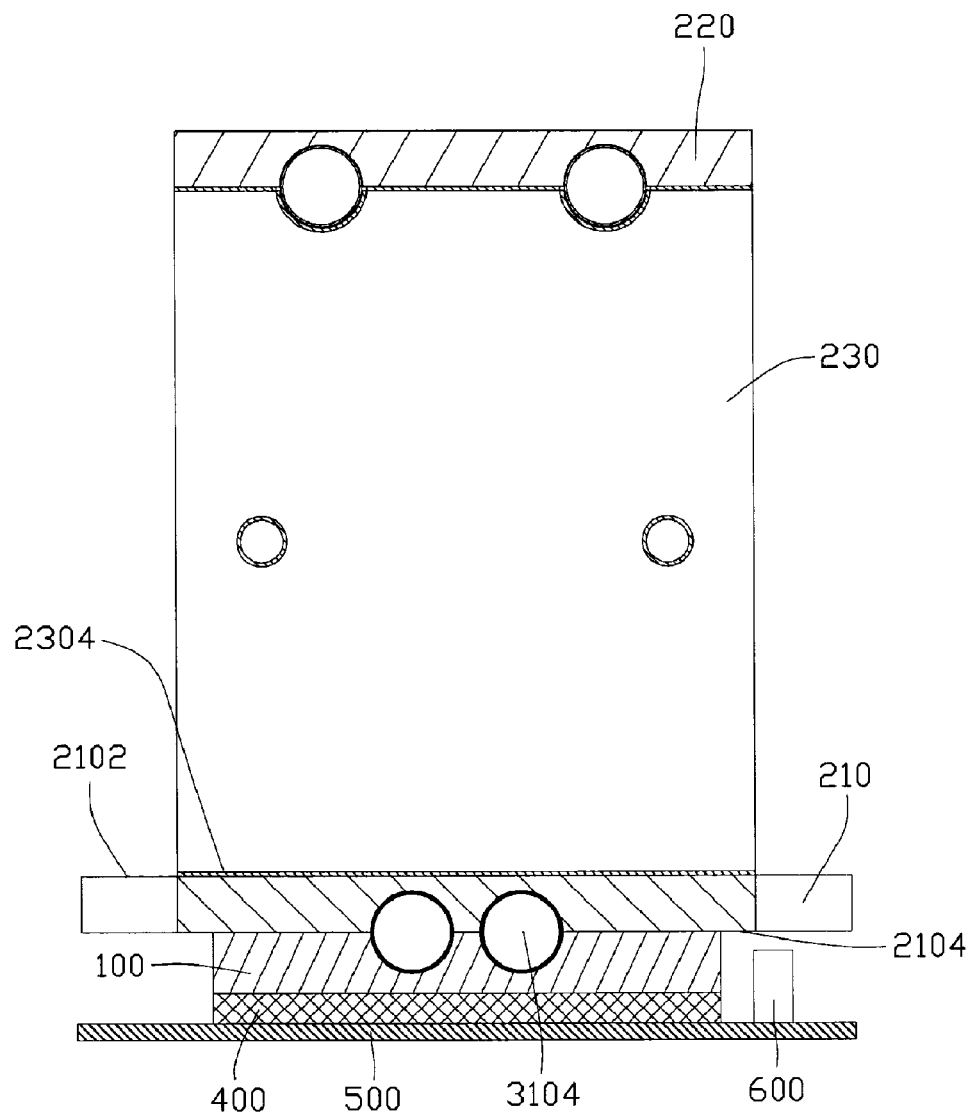
FIG. 2 is a cross section view of the heat dissipation device, taken along a line II-II of FIG. 1, and together with an electronic component to be cooled and a capacitor mounted on a printed circuit board.
Figure 3:
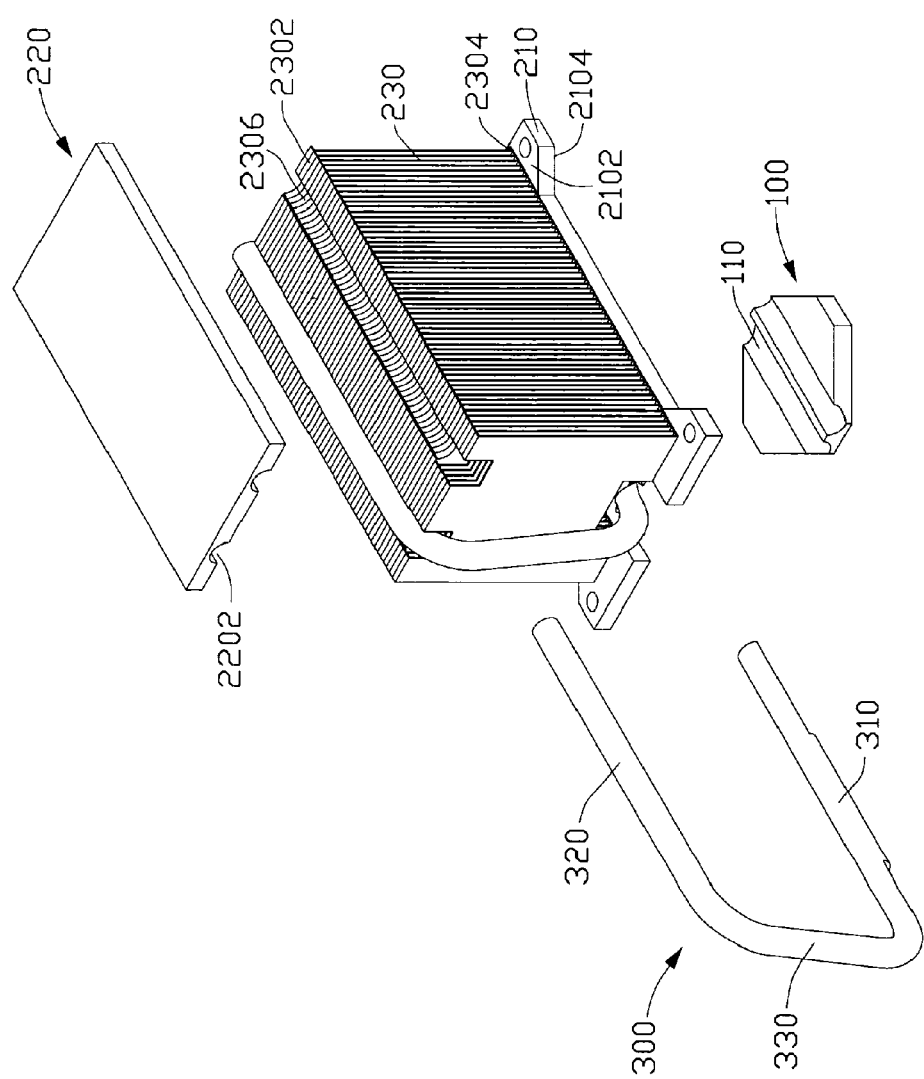
FIG. 3 is an exploded view of FIG. 1.
Figure 4:
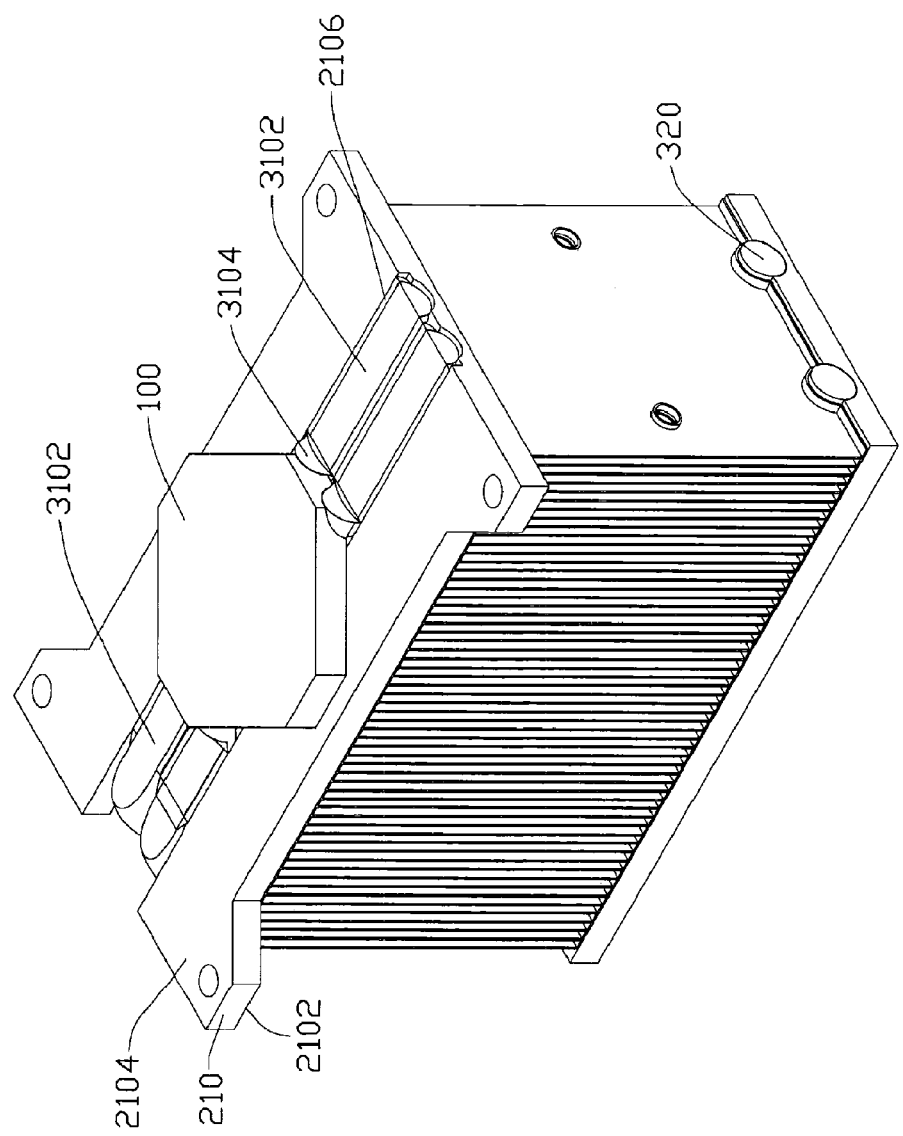
FIG. 4 is similar to FIG. 1, but viewed from a different aspect, clearly showing a bottom structure of the heat dissipation device.
Figure 5:
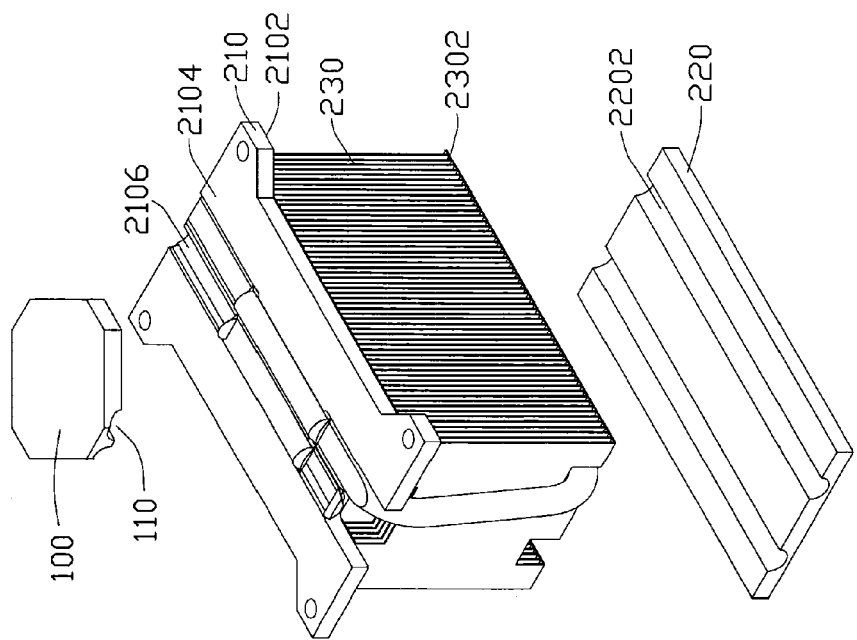
FIG. 5 is a partially exploded view of FIG. 4.
Figure 5:
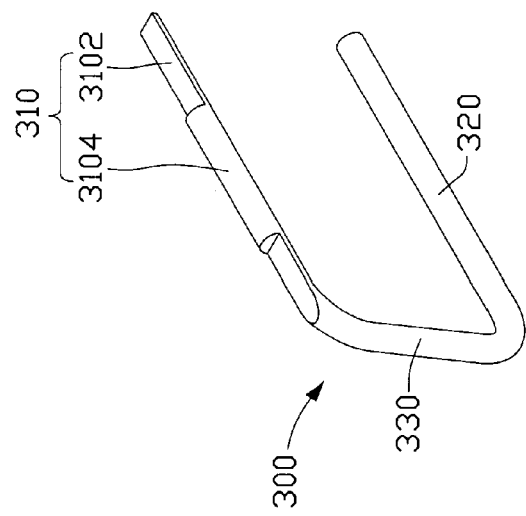

The heat conducting plate 100 is made of heat conductive material such as copper or aluminum, and is used for contacting with an electronic component 400 mounted on a printed circuit board 500 and absorbing heat therefrom. The heat conductive plate 100 comprises a pair of parallel grooves 110 defined in an upper portion thereof for receiving heat pipes 300 and conducting the heat to the heat pipes 300. The heat conducting plate 100 is also used for preventing the heat dissipation device of present invention from interfering with other component 600 mounted on the printed circuit board 500. The thickness of the heat conducting plate 100 is designed to keep the heat sink 200 spaced from the component 600. Therefore, the heat sink 200 can be designed to have a larger heat-exchanging area to improve heat dissipation efficiency without worrying about interfering with the component 600. The other component 600 as shown in FIG. 2 is a capacitor.

The heat sink 200 comprises a base 210, a cover 220 spaced from and parallel to the base 210, and a plurality of fins 230 extending between the base 210 and the cover 220.

The base 210 is made of heat conductive material such as copper or aluminum, and has a size larger than that of the heat conducting plate 100. The base 210 has a top surface 2102 facing a bottom surface 2304 of the fins 230, and a bottom surface 2104 facing the heat conducting plate 100. A pair of parallel grooves 2106 is defined in a bottom surface 2104 of the base 210, and is aligned with corresponding grooves 110 of the heat conducting plate 100, respectively. The grooves 110, 2106 of the heat conducting plate 100 and the base 210 cooperatively form two passages for accommodating the heat pipes 300, respectively. The grooves 2106 are longer than the grooves 110.

The cover 220 defines a pair of parallel channels 2202 extending from one side thereof to an opposite side. Opposite top and bottom edges of the fins 230 are bent to form a plurality of heat conducting flanges (not labeled). The heat conducting flanges cooperatively form top and bottom surfaces 2302, 2304 of the fins 230. The bottom surface 2304 of the fins 230 is attached to the top surface 2102 of the base 210. A pair of channels 2306 is defined in the top surface 2302 of the fins 230 aligned with the channels 2202 of the cover 220. The channels 2306, 2202 of the fins 230 and the cover 220 cooperatively form two passages for accommodating the heat pipes 300, respectively.

Each heat pipe 300 has a U-shaped configuration, and forms a capillary structure therein. A quantity of working medium such as water is contained in the heat pipe 300. The heat pipe 300 comprises parallel and separate first and second heat-conducting portions 310, 320. The first heat-conducting portion 310 is used for absorbing heat from the heat conducting plate 100 and constructs as an evaporating section of the heat pipe 300. The second heat-conducting portions 320 are used for dissipating the heat from the first heat-conducting portions 310 to the cover 220 and the fins 230, and constructs as condensing sections of the heat pipes 300. Each heat pipe 300 further comprises a third portion 330 interconnecting the first and second heat-conducting portions 310, 320 together. The working medium circuits between the first and second heat-conducting portions 310, 320 along the third portion 330 to transfer heat from the first heat-conducting portion 310 to the second heat-conducting portion 320.

Figure 6:
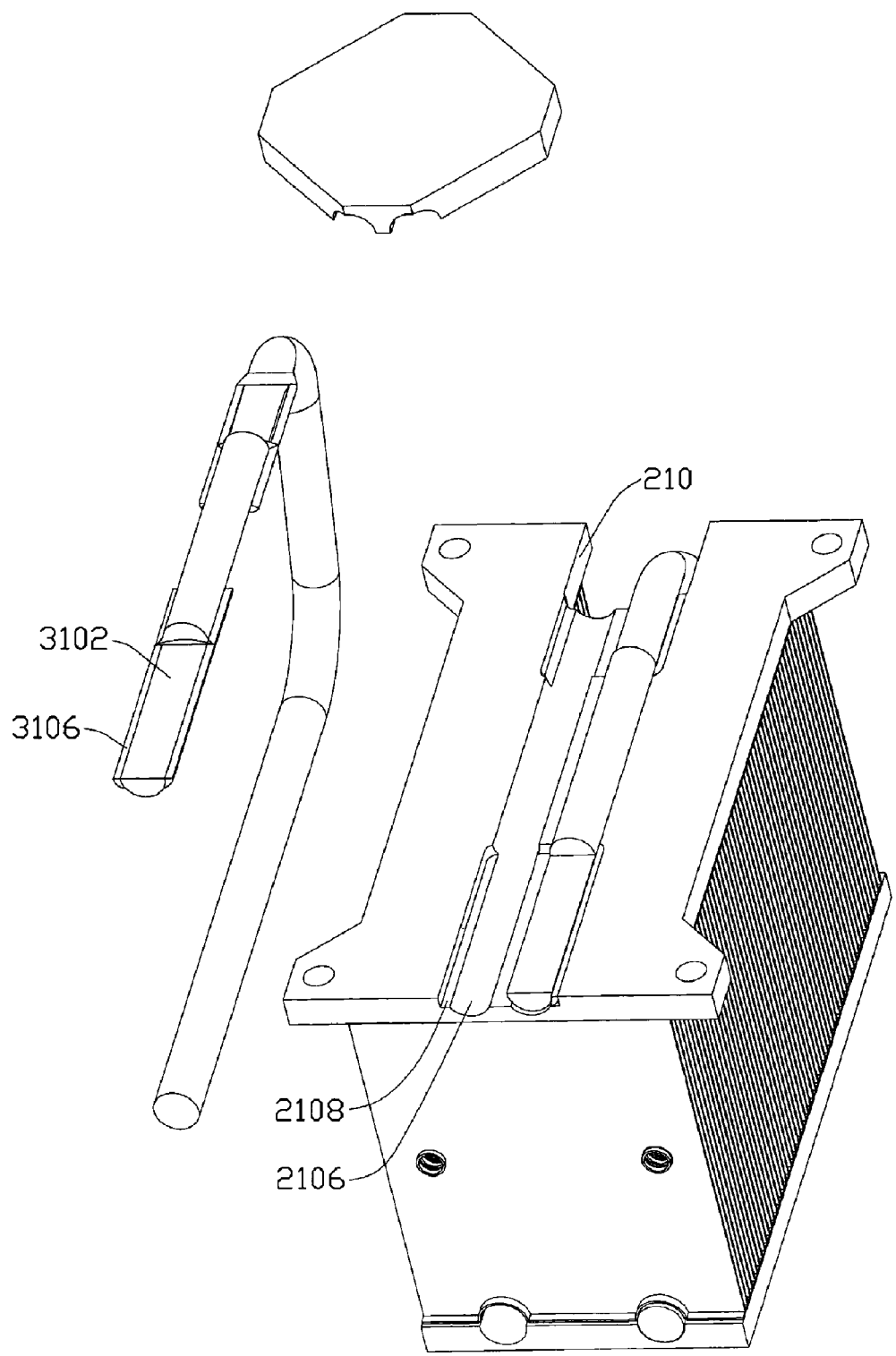
FIG. 6 is a partially exploded view of FIG. 4, clearly showing a bottom structure of the heat dissipation device.

The first heat-conducting portion 310 may be divided into three portions, which are a pair of opposite end portions 3102 and a middle portion 3104 having a circular cross section. Each end portion 3102 of the heat pipes 300 forms a flat surface and a convex surface, and thus has a semi-circular cross section. As we known, in the process of forming the flat surfaces by pressing, the capillary structure within the heat pipes 300 may be damaged. Referring to FIG. 6, in order to mitigate the damage of the capillary structure within the heat pipes 300, a plurality of cutouts 2108 may be formed in opposite sides of the grooves 2106 of the base 210. Therefore, when opposite end portions 3102 of the heat pipes 300 are flattened by pressing, expanded segments 3106 are formed on opposite sides of the heat pipes 300 and are accommodated into the cutouts 2108 of the base 210, which will reduce the damage of the capillary structure within the heat pipes 300.

When the heat pipes 300 and the heat sink 200 are assembled together, the flat surfaces of the end portions 3102 and the bottom surface 2104 of the base 210 are positioned in a same plane to avoid interfering with the other component 600 around the electronic component 400. The middle portions 3104 are received in the passages formed by the grooves 110, 2106 of the heat conducting plate 100 and the base 210. Thus, the middle portions 3104 are sandwiched between the heat conducting plate 100 and the heat sink 200. Heat absorbed by the heat conducting plate 100 can be simultaneously transferred to the base 210 of the heat sink 200 and the first heat-conducting portions 310 of the heat pipes 300. The second heat-conducting portions 320 of the heat pipes 300 are received in the passages formed by the channels 2306, 2202 of the fins 230 and the cover 220. Moreover, the distance between the second heat-conducting portions 320 is different from that of the first heat-conducting portions 310, as avails to uniformly spread heat at the top surface 2302 of the fins 230.

In utilization of the heat dissipation device, the heat conducting plate 100 is attached to an upper surface of the electronic component 400 to be cooled. The bottom surface 2104 of the base 210 is spaced from a top surface of the other component 600 beside the electronic component 400 to be cooled, due to the heat conducting plate 100 (shown in FIG. 2). The end portions 3102 of the first heat-conducting portion 310 of the heat pipes 300 are flattened to avoid interfering with the other component 600 around the electronic component 400 to be cooled.

As we know, most metals have higher heat resistance than that of heat pipes. The middle portions 3104 of the first heat-conducting portion 310 of the heat pipes 300 are accommodated in the grooves 110 defined in the heat conducting plate 100 to reduce a distance between the first heat-conducting portions 310 of the heat pipes 300 and the electronic component 400 to be cooled. This avails to reduce the heat resistance between the electronic component 400 and the first heat-conducting portion 310 of the heat pipes 300. Therefore, the heat produced by the electronic component 400 is absorbed by the heat conducting plate 100, then is quickly transferred to the first heat-conducting portions 310 of the heat pipes 300, then to the fins 230 to be dissipated.

In the preferred embodiment of the present invention, the connections between the heat pipes 300 and the base 210, between the heat pipes 300 and the cover 220, between the heat pipes 300 and the fins 230 is by any conventional joint means such as soldering.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat conducting plate adapted for contacting with an electronic component, the heat conducting plate comprising a groove defined therein;
   a heat sink mounted on the heat conducting plate; and
   a heat pipe comprising an evaporating portion sandwiched between the heat conducting plate and the heat sink, and a condensing portion thermally engaging with the heat sink, the evaporating portion comprising a middle portion having a circular cross section and accommodated in the groove of the heat conducting plate, and a pair of end portions formed on opposite sides of the middle portion, each of the end portions having a semi-circular cross section and a flat surface formed thereon;
   wherein the end portions of the evaporating portion of the heat pipe are located outside two opposite sides of the heat conducting plate, respectively;
   wherein the heat sink comprises a base facing the heat conducting plate and a plurality of fins mounted on the base;
   wherein the base comprises a groove defined therein and aligned with the groove of the heat conducting plate to receive the evaporating portion of the heat pipe; and wherein the flat surfaces of the end portions are coplanar with a bottom surface of the heat sink.

2. The heat dissipation device as claimed in claim 1, wherein at least one cut is formed on at least one side of the groove of the base.

3. The heat dissipation device as claimed in claim 2, wherein at least one expanded segment is formed on at least one side of the end portions of the heat pipe and received in the at least one cut of the base.

4. The heat dissipation device as claimed in claim 1, wherein the heat sink further comprises a cover mounted on the fins.

5. A heat dissipation device comprising:
a heat conducting plate having a bottom face adapted for contacting with a heat-generating electronic component, and a top face defining a groove therein;
a heat sink mounted on the heat conducting plate; and
a heat pipe having an evaporation portion with a first portion received in the groove and thermally connecting with the heat conducting plate and a second portion outside the groove, the second portion having a bottom which is located above a bottom of the first portion, and a condensing portion thermally connecting with the heat sink;
wherein the evaporating portion of the heat pipe has a linear configuration and the first portion and the second portion are in line with each other and both located under the heat sink;
wherein the bottom of the second portion is flat, and the bottom of the first portion is curved;
wherein the flat bottom of the second portion is configured for receiving another electronic component therebelow; and
wherein the flat bottom of the second portion is substantially coplanar with a bottom face of the heat sink.

6. The heat dissipation device as claimed in claim 5, wherein the another electronic component is a capacitor.

* * * * *